(12) United States Patent
Chang et al.

(10) Patent No.: US 9,345,132 B2
(45) Date of Patent: May 17, 2016

(54) SUBSTRATE STRUCTURE AND THE PROCESS MANUFACTURING THE SAME

(71) Applicants: Yu-Ru Chang, Hsinchu County (TW); Yu-Fang Hsia, Hsinchu (TW); Ling-Chih Chou, Taipei (TW)

(72) Inventors: Yu-Ru Chang, Hsinchu County (TW); Yu-Fang Hsia, Hsinchu (TW); Ling-Chih Chou, Taipei (TW)

(73) Assignees: Global Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 545 days.

(21) Appl. No.: 13/761,172

(22) Filed: Feb. 7, 2013

(65) Prior Publication Data

US 2014/0216802 A1    Aug. 7, 2014

(51) Int. Cl.
  *H05K 1/03* (2006.01)
  *H05K 1/02* (2006.01)
  *H01L 23/498* (2006.01)
  *H01L 23/60* (2006.01)

(52) U.S. Cl.
  CPC ........ *H05K 1/0286* (2013.01); *H01L 23/49822* (2013.01); *H01L 23/49838* (2013.01); *H01L 23/60* (2013.01); *H01L 2924/0002* (2013.01); *H05K 2201/09127* (2013.01); *H05K 2201/09972* (2013.01); *H05K 2203/0228* (2013.01); *Y10T 29/49155* (2015.01)

(58) Field of Classification Search
  None
  See application file for complete search history.

(56) References Cited

U.S. PATENT DOCUMENTS

| | | | | |
|---|---|---|---|---|
| 3,548,494 A | * | 12/1970 | Haring | 29/847 |
| 4,316,320 A | * | 2/1982 | Nogawa et al. | 29/839 |
| 4,547,795 A | * | 10/1985 | Wulff | 257/665 |
| 5,744,224 A | * | 4/1998 | Takeuchi et al. | 428/209 |

* cited by examiner

*Primary Examiner* — Steven T Sawyer
(74) *Attorney, Agent, or Firm* — Min-Lee Teng; Litron Patent & Trademark Office

(57) ABSTRACT

The present invention discloses a package substrate layout design to achieve multiple substrate functions for engineering development and verification. The substrate layout contains a connection structure to connect to a plurality of power/ground domains on the package substrate. With different combination of the cutting lines on the package substrate, the invention can achieve multiple substrate functions without impacting the customer's PCB or system board design and provide cost effective and fast cycle time for engineering development phase.

10 Claims, 7 Drawing Sheets

SUBSTRATE STRUCTURE AND THE PROCESS MANUFACTURING THE SAME

BACKGROUND OF THE INVENTION

1. Field of the Invention

The invention relates in general to a package structure and, in particular, to a substrate structure providing more flexibility.

2. Background of the Invention

An integrated circuit chip usually comprises a plurality of functional block. Each of the plurality of functional block may need different environment due to the EMI, ESD, or other concern.

Conventionally, as shown in FIG. 1, in a procedure of a researching and designing, there is a substrate 10 in a package structure. The substrate 10 is divided into a plurality of power/ground domain 101. Each of the plurality of power/ground domain is separated from other power/ground domains. An IC chip 102 is mounted on the substrate 10. An engineer verifies the IC chip 102 in EMI, ESD or other aspects by the package structure. After verifying and testing, a new arrangement of the plurality of power/ground domain is generated. However, it takes a long time to verify many different aspects of an IC chip based on the conventional substrate 10. Hence, the time of researching and designing is extended.

Therefore, what is needed is a new substrate structure with more design flexibility to shorten the time of researching and designing.

SUMMARY OF THE INVENTION

One purpose of this invention is to provide a new substrate structure of a package structure.

In one embodiment, a double-keep-out substrate with a plurality of power/ground domain and a connecting structure is disclosed. The connecting structure is enclosed by a first keep-out region and enclosing a second keep-out region. The second keep-out region encloses the plurality of power/ground domain. Each of the plurality of power/ground domain connects with the connecting structure with one or more connecting portion.

In one embodiment, a portion of the connecting structure of the double-keep-out substrate is sawed along an outer boundary of the second keep-out region so that at least one power/ground domain is separated from the other power/ground domains. As a consequence, the plurality of power/ground domain is divided into at least two groups of power/ground domains.

With the brief description of drawings and detailed description of embodiment disclosed below, advantage, scope, and technical details of this invention are easy to be understood.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

In this invention, a package structure is disclosed. Compared with conventional structures, the disclosed package structure provides more flexibility.

Figure 1:
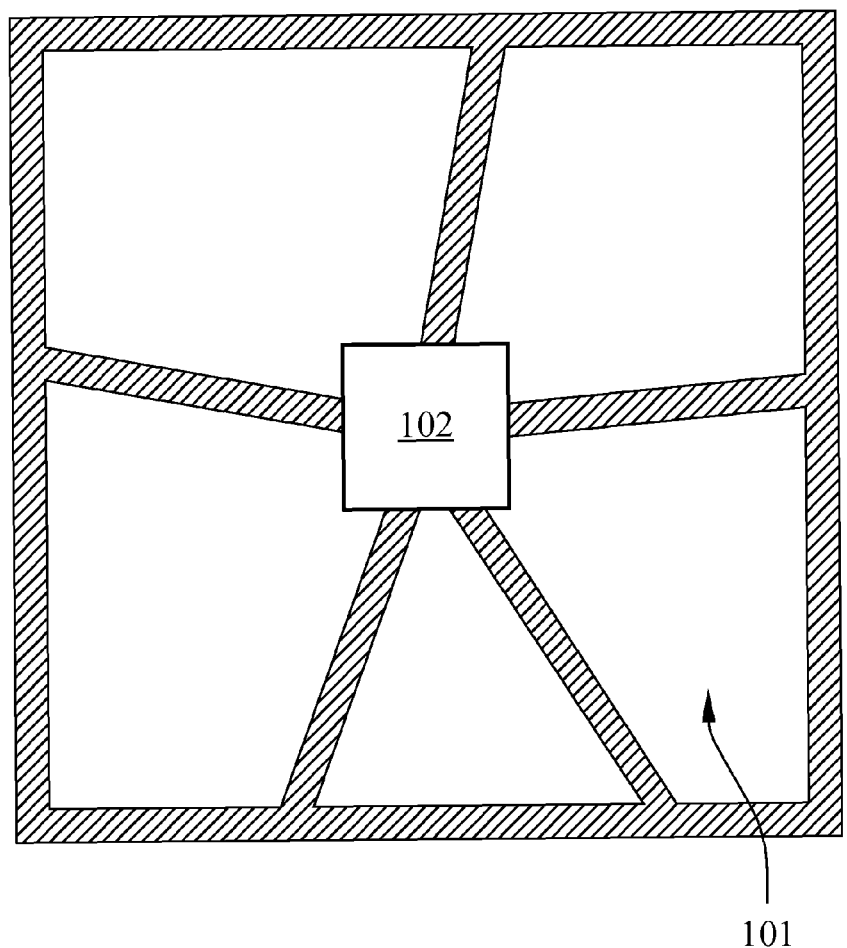
FIG. 1 illustrates a conventional substrate structure.
Figure 2A:
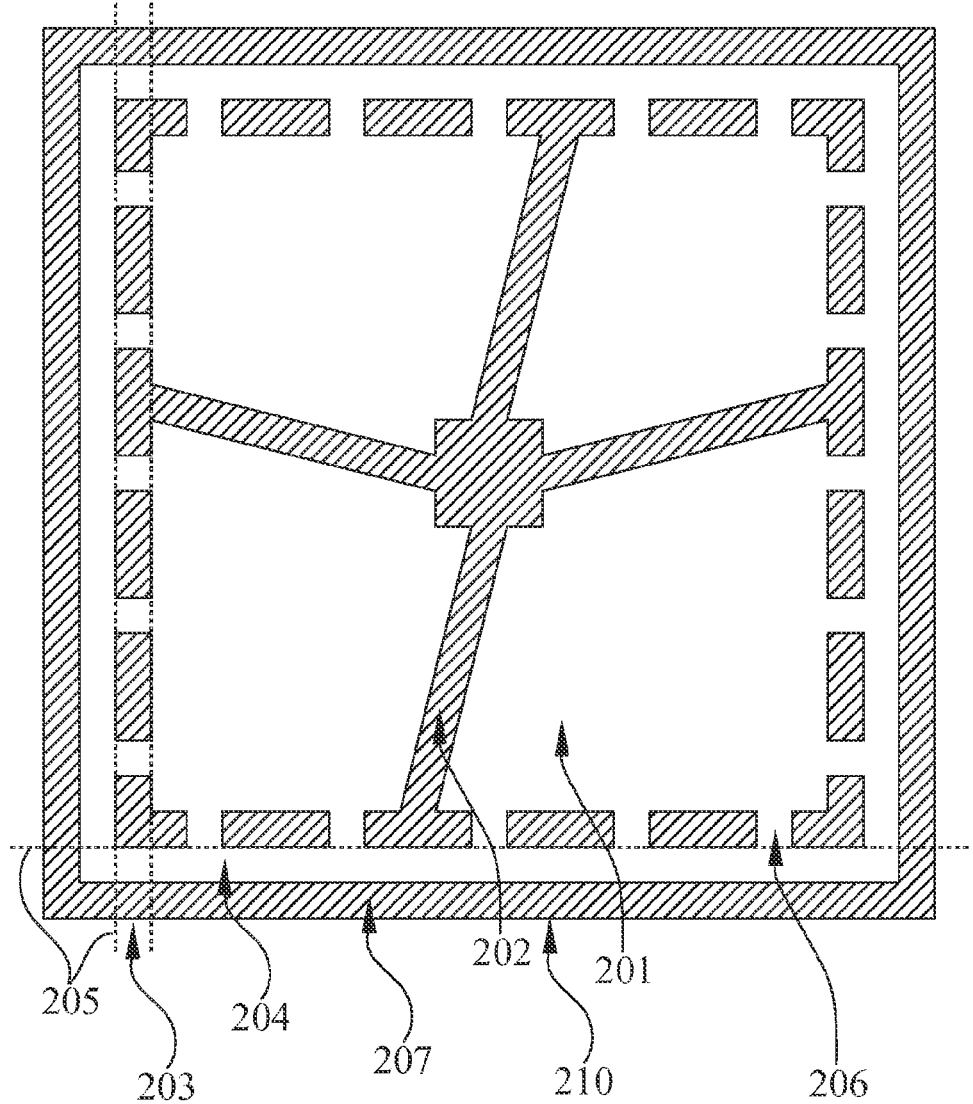
FIG. 2A illustrates a substrate structure in accordance with one embodiment of this invention.

In brief, please refer to FIG. 2A which illustrates an intermediate layer 210 of a substrate 20 according to one embodiment of this invention, in the layer 210, there is a plurality of conductive region 201, wherein each of the plurality of conductive region 201 is formed with a conductive material such as certain metal. Between each adjacent conductive region 201 is an isolation border 202 separating said each adjacent conductive region 201, wherein the isolation border is formed with an insulating material such as PP, polyimide, $FR_4$, and etc. A first keep-out region 203 encloses said plurality of conductive region 201. A connecting structure 204 encloses said first keep-out region 203. Between the connecting structure 204 and the first keep-out region 203 is a sawing line 205 so that the substrate 20 is capable of being sawed along the sawing line 205. The connecting structure 204 connects to each of the plurality of conductive region 201 via at least one connecting portion 206. That is, the connecting portion 206 is in the first keep-out region 203. The connecting structure 204 is enclosed by a second keep-out region 207. The first keep-out region 203 is filled with an insulating material besides the at least one connecting portion 206. The second keep-out region 207 is also filled with the insulating material.

Figure 2B:
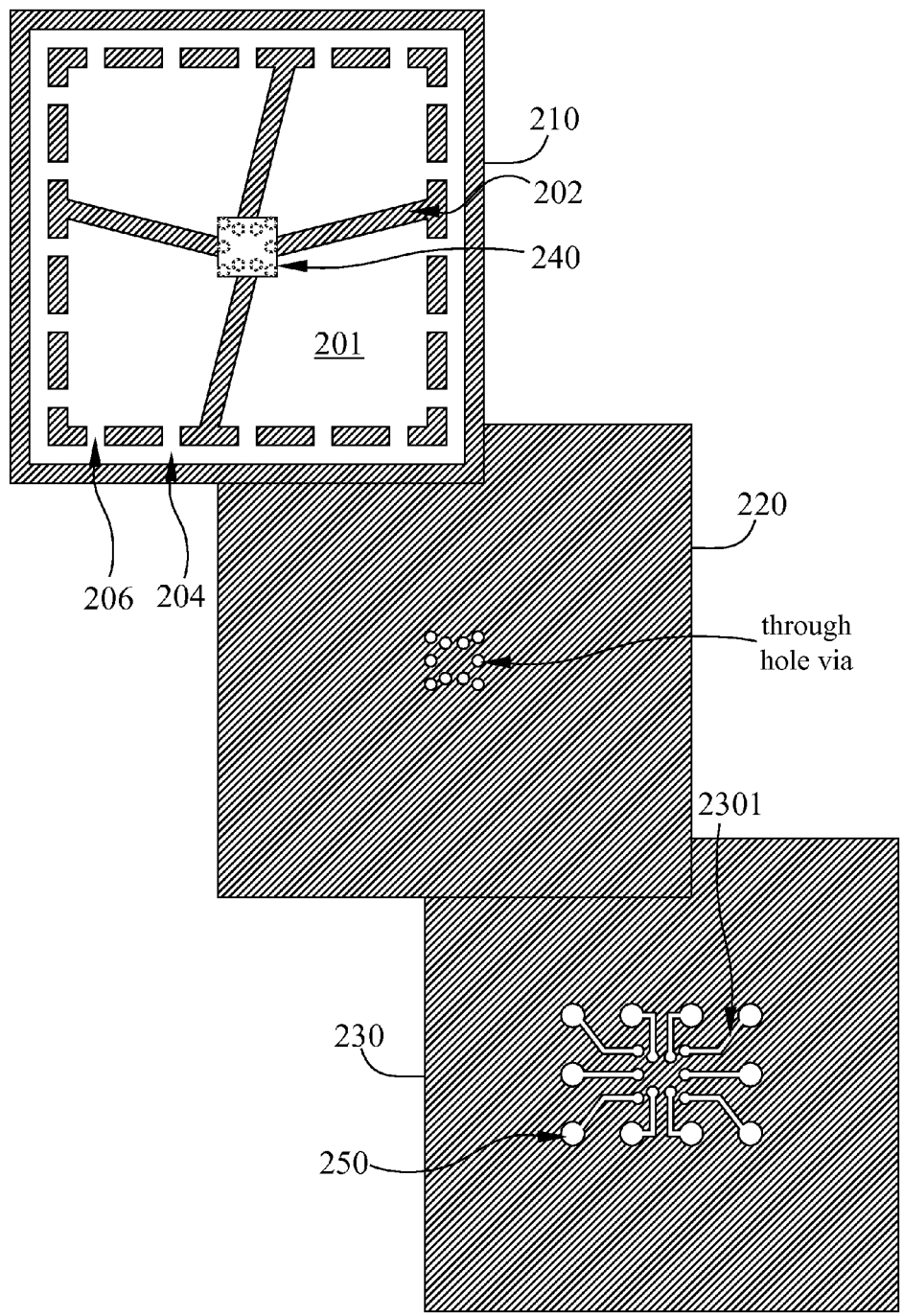
FIG. 2B illustrates a cross-section view of the substrate structure of FIG. 2A.

Please refer to FIG. 2B which illustrate a multi-layer view of the substrate 20. The used layer of the substrate 20 is not limited, and the layer number depends on design concerns. The substrate 20 comprises a first layer 210, a second layer 220, and a third layer 230. An IC chip 240 is mounted on the substrate 20. The plurality of conductive region 201, the isolation border 202, the connecting structure 204, and the connecting portion 206 are in the first layer 210. But for design concerns, the conductive region 201, the isolation border 202, the connecting structure 204 and the connecting portion 206 can be installed on other layer as well. The third layer 230 comprises a plurality of network 2301 which connects with ball pads 250 of the substrate 20. The second layer 220 is an insulating layer comprising a plurality of through hole via connects pads of the IC chip 240 and the plurality of conductive region 201 with the plurality of network in the third layer 230 so that the pads of the IC chip 240 and the plurality of conductive region 201 is electrically coupled to the ball pads of the substrate. Although only a substrate with three layers is disclosed, a substrate with more layers is easily to be manufactured with the same concept. Also, a substrate with more than one ring connecting structure is easy to be manufactured and applied.

Figure 3:
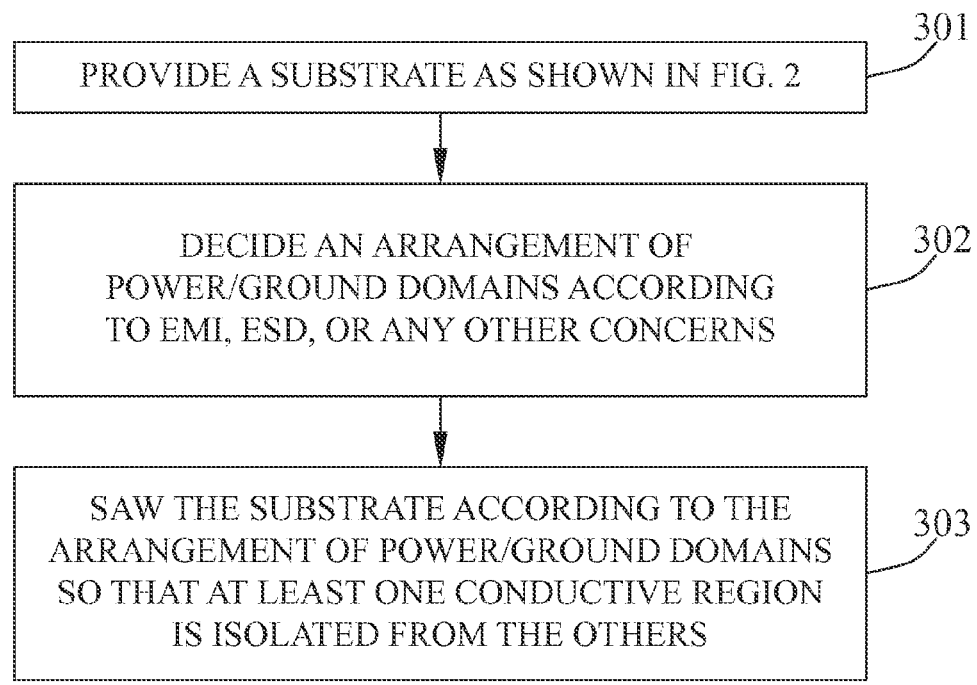
FIG. 3 illustrates a flow chart in accordance with one embodiment of this invention.

In one embodiment, please refer to FIG. 3 which illustrates a flow chart in accordance with this invention, first, a substrate as shown in FIG. 2 is provided, as step 301. Second, an arrangement of power/ground domains is decided according to EMI, ESD, or any other concerns, as step 302. The substrate is sawed according to the arrangement of power/ground domains so that at least one conductive region is isolated from the other conductive regions, wherein the substrate is sawed along the sawing line 205, as step 303.

Figure 4:
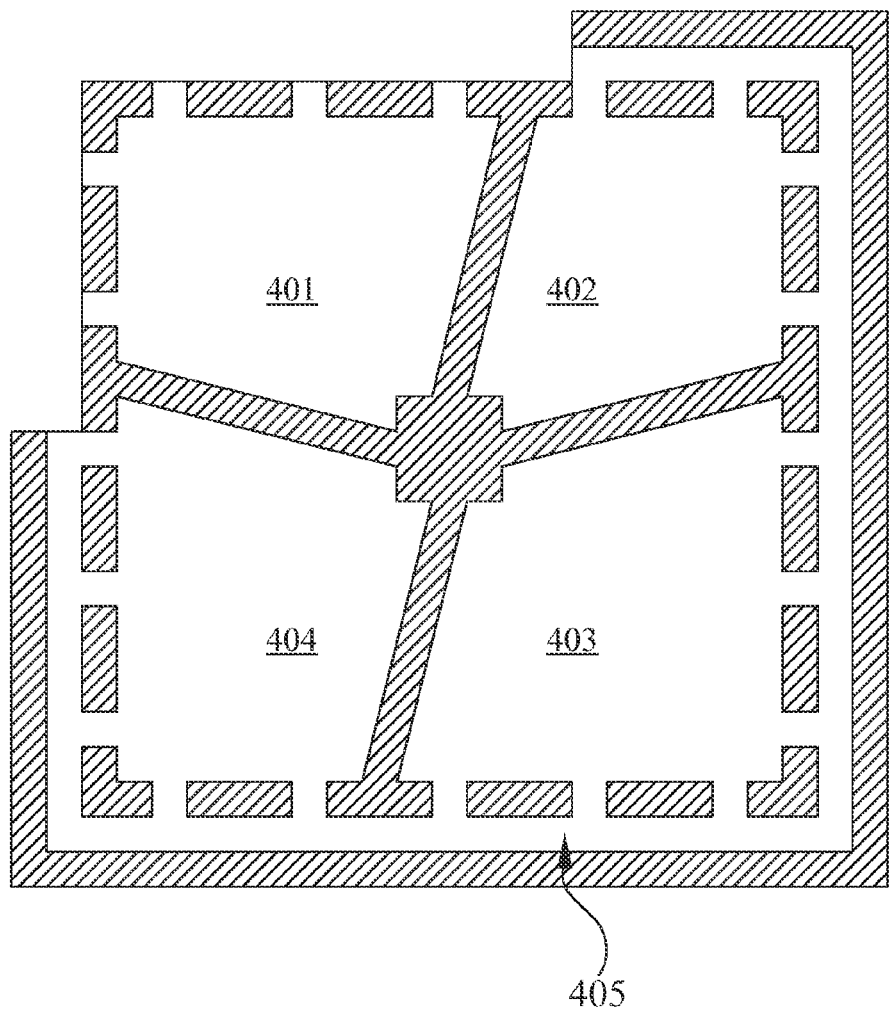
FIG. 4 illustrates a sawed substrate in accordance with one embodiment of this invention.

In one embodiment, please refer to FIG. 4 which illustrates a sawed substrate in this invention, a substrate 40 comprises four conductive regions 401, 402, 403, 404, and a connecting structure 405. A portion of the connecting structure 405 is sawed so that the conductive region 401 is not connected with the other conductive regions. In other words, the substrate 40 is divided into two power/ground domains. A first power/ground domain comprises the conductive region 401. A second power/ground domain comprises the conductive regions 402, 403, and 404.

Figure 5A:
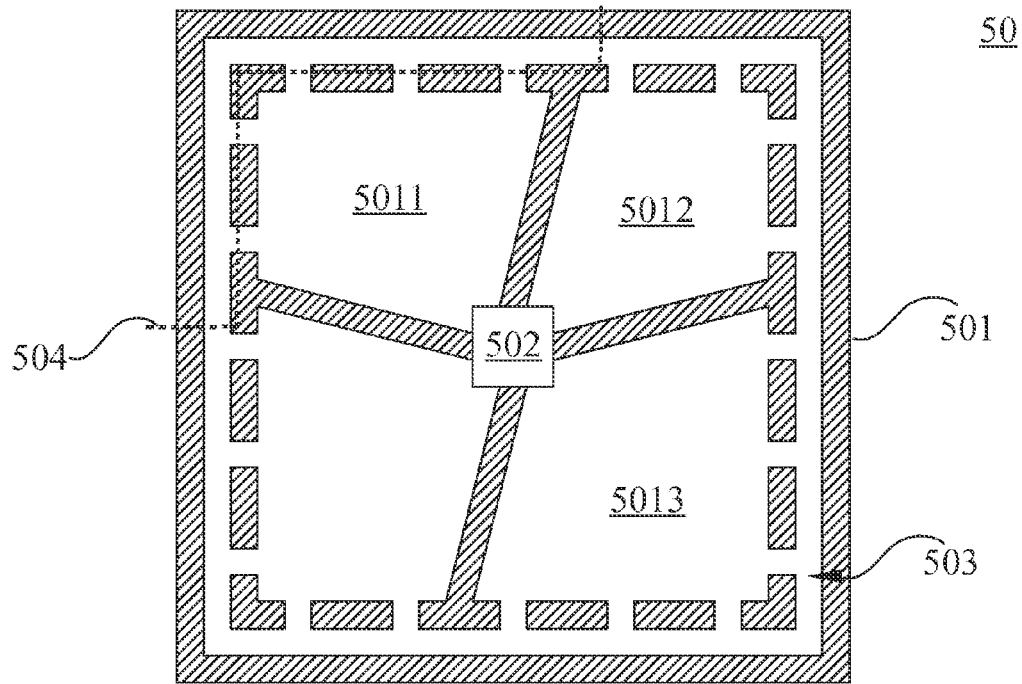
FIGS. 5A and 5B illustrate an example in accordance with one embodiment of this invention.
Figure 5B:
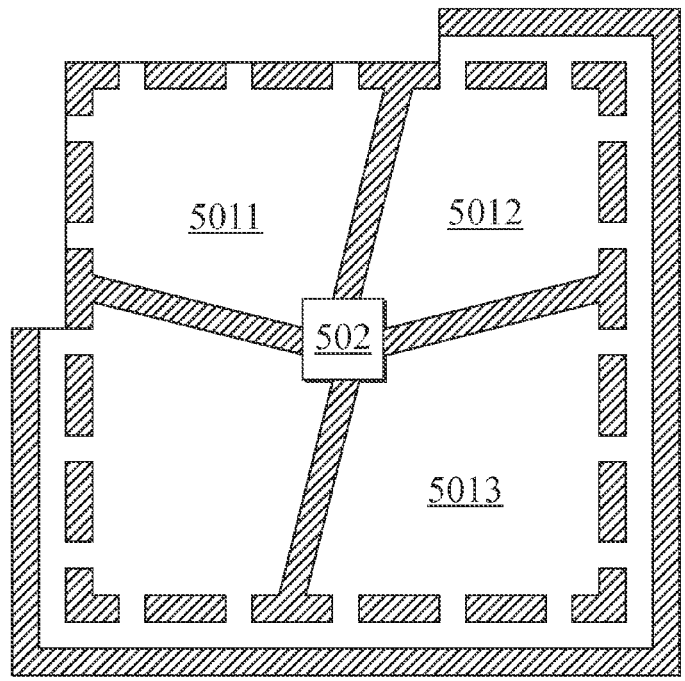

In one embodiment, please refer to FIG. 5A which illustrates an example of in accordance with this invention, a package 50 comprises a substrate 501, an IC chip 502 mounted on the substrate 501, and a connecting structure 503. A first set of pins of the IC chip 502 has more concern in EMI and is located in a first conductive region 5011. A second set of pins of the IC chip 502 has more concern in ESD and is located in a second conductive region 5012. A third set of pins of the IC chip 502 has more concern in noise and is located in a third conductive region 5013. That is, the first set of pins of the IC chip 502 needs an isolated power/ground domain. That is, the first conductive region 5011 needs to be isolated from the second conductive region 5012 and the third conductive region 5013. A portion of the connecting structure 503 is sawed along a sawing line 504 so that the first conductive region 5011 is then electrically isolated from the second conductive region 5012 and the third conductive region 5013, as shown in FIG. 5B.

Figure 6:
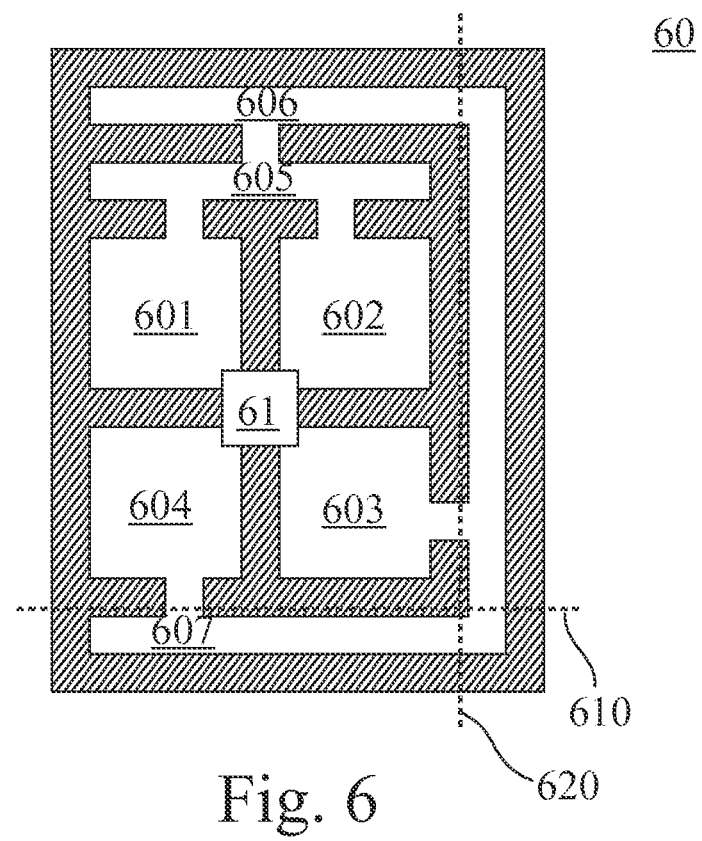
FIG. 6 illustrates another substrate structure in accordance with one embodiment of this invention.

In one embodiment, please refer to FIG. 6 which illustrates a substrate structure with a plurality of connecting structure, a substrate 60 comprises a first conductive region 601, a second conductive region 602, a third conductive region 603, a fourth conductive region 604, a first connecting structure 605, a second connecting structure 606, and a third connecting structure 607. An IC chip 61 is mounted on the substrate 60, wherein a first ground pin of the IC chip 61 connects to the first conductive region 601; a second ground pin of the IC chip 61 connects to the second conductive region 602; a third ground pin of the IC chip 61 connects to the third conductive region 603; and a fourth ground pin of the IC chip 61 connects to the fourth conductive region 604. When manufacturing, if the first and the second ground pins of the IC chip 61 are most likely to be connected together, the first connecting structure 605 can be used to connect the first conductive region 601 and the second conductive region 602. Likewise, if the third ground pin of the IC chip 61 has a higher possibility to connect to the first and the second ground pins than the fourth ground pin of the IC chip 61, the second connecting structure 606 connects the third conductive region 603 and the first connecting structure 605. Also, the third connecting structure 607 connects the fourth conductive region 604 and the second connecting structure 606. In other words, the fourth ground pin of the IC chip 61 is most likely to be isolated from the other ground pins of the IC chip 61.

While verifying the functionality of the IC chip 61, if it's found that the fourth ground pin of the IC chip 61 needs to be isolated from the other ground pins of the IC chip 61, the third connecting structure is removed by sawing the substrate 60 along a first sawing line 610. If then it's found that the third ground pin of the IC chip 61 still has to be isolated from the first and the second ground pins of the IC chip 61, the second connecting structure is then removed by sawing the substrate 60 along a second sawing line 620. With such structure and such method, the substrate 60 is capable of forming different arrangement of the ground pins of the IC chip 61.

In one embodiment, the connecting structure and the plurality of conductive region are in the same layer on the substrate. In another embodiment, the connecting structure and the plurality of conductive region can be in different layer on the substrate.

According to this invention, a new structure of a substrate of a package is provided. The new structure is capable of being sawed along a sawing line so that the substrate is capable of being divided into a plurality of arrangement of power/ground domains. That is, a plurality of different substrate structure is capable of being derived from the new structure in this invention.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

The invention claimed is:

1. A substrate structure comprising:
a plurality of conductive regions, wherein each two adjacent conductive regions are separated by an isolation border; and
a connection structure along at least one side of the substrate structure, wherein the connection structure is electrically connected with at least two conductive regions of the plurality of conductive regions and is in contact with at least one isolation border, each of the at least one isolation border being adjacent to at least one of the at least two conductive regions, wherein when the connection structure along the at least one side of the substrate structure is not present, the at least two conductive regions of the plurality of conductive regions are not electrically connected to each other, wherein the connection structure comprises a first pattern and a second pattern, wherein the first pattern is electrically connected with a first group of conductive regions of the plurality of conductive regions along a first side of the substrate and is electrically connected with a second group of conductive regions of the plurality of conductive regions along a second side of the substrate, wherein the first group of conductive regions and the second group of conductive regions are electrically connected by the second pattern along a same side of the substrate.

2. The substrate structure of claim 1, wherein the isolation borders are formed with an insulating material.

3. The substrate structure of claim 1, wherein each of the plurality of conductive regions belongs to a power/ground domain.

4. The substrate structure of claim 1, wherein the plurality of conductive region is enclosed by a first keep-out region; the first keep-out region is enclosed by the connecting structure; and the connecting structure is enclosed by a second keep-out region.

5. The substrate structure of claim 1, wherein the connection structure is electrically connected with each of the plurality of conductive regions and is in contact with each isolation border.

6. The substrate structure of claim 1, wherein the connection structure along the at least one side of the substrate can be cut off from the substrate to isolate said at least two conductive regions of the plurality of conductive regions.

7. A method for forming a substrate structure, comprising the steps of:
   forming a plurality of conductive regions, wherein each two adjacent conductive regions are separated by an isolation border; and
   forming a connection structure along at least one side of the substrate, wherein the connection structure is electrically connected with at least two conductive regions of the plurality of conductive regions and is in contact with at least one isolation border, each of the at least one isolation border being adjacent to at least one of the at least two conductive regions, wherein when the connection structure along the at least one side of the substrate structure is not present, the at least two conductive regions of the plurality of conductive regions are not electrically connected to each other, wherein the connection structure comprises a first pattern and a second pattern, wherein the first pattern is electrically connected with a first group of conductive regions of the plurality of conductive regions along a first side of the substrate and is electrically connected with a second group of conductive regions of the plurality of conductive regions along a second side of the substrate, wherein the first group of conductive regions and the second group of conductive regions are electrically connected by the second pattern along a same side of the substrate.

8. The method for forming a substrate structure according to claim 7, further comprising the step of: cutting off the second pattern of the connection structure from the substrate to isolate the first group of conductive regions and the second group of conductive regions.

9. The method for forming a substrate structure according to claim 7, wherein the plurality of conductive region is enclosed by a first keep-out region; the first keep-out region is enclosed by the connecting structure; and the connecting structure is enclosed by a second keep-out region, further comprising the step of: cutting off the second pattern of the connection structure from the substrate to isolate the first group of conductive regions and the second group of conductive regions.

10. A substrate structure comprising:
   a plurality of conductive regions, wherein each two adjacent conductive regions are separated by an isolation border; and
   a connection structure along at least one side of the substrate structure, wherein the connection structure is electrically connected with at least two conductive regions of the plurality of conductive regions and is in contact with at least one isolation border, each of the at least one isolation border being adjacent to at least one of the at least two conductive regions, wherein when the connection structure along the at least one side of the substrate structure is not present, the at least two conductive regions of the plurality of conductive regions are not electrically connected to each other, wherein the connection structure comprises a first pattern and a second pattern, wherein the first pattern is electrically connected with a first group of conductive regions of the plurality of conductive regions along a first side of the substrate and is electrically connected with a second group of conductive regions of the plurality of conductive regions along a second side of the substrate, wherein the first group of conductive regions and the second group of conductive regions are electrically connected by the second pattern along a same side of the substrate, wherein the second pattern of the connection structure of the substrate can be cut off from the substrate to isolate the first group of conductive regions and the second group of conductive regions.

\* \* \* \* \*